United States Patent [19]

Yamada et al.

[11] Patent Number: 5,394,429
[45] Date of Patent: Feb. 28, 1995

[54] DISTRIBUTED-FEEDBACK LASER WITH IMPROVED ANALOG MODULATION DISTORTION CHARACTERISTICS AND METHOD FOR FABRICATING THE SAME

[75] Inventors: Hirohito Yamada; Tetsuro Okuda; Toshitaka Torikai, all of Tokyo, Japan

[73] Assignee: NEC Corporation, Tokyo, Japan

[21] Appl. No.: 144,038

[22] Filed: Nov. 1, 1993

[30] Foreign Application Priority Data

Oct. 30, 1992 [JP] Japan .................................. 4-292851
Oct. 30, 1992 [JP] Japan .................................. 4-292852

[51] Int. Cl.$^6$ .............................................. H01S 3/08
[52] U.S. Cl. .......................................... 372/96; 372/44
[58] Field of Search ............... 372/96, 44, 50; 385/14

[56] References Cited

U.S. PATENT DOCUMENTS

| | | | |
|---|---|---|---|
| 4,899,361 | 2/1990 | Numai | 372/96 |
| 4,951,292 | 8/1990 | Kuindersma et al. | 372/96 |
| 4,995,048 | 2/1991 | Kuindersma et al. | 372/96 |

FOREIGN PATENT DOCUMENTS

| | | |
|---|---|---|
| 2-20087 | 1/1990 | Japan . |
| 2-90688 | 3/1990 | Japan . |
| 2-1722289 | 7/1990 | Japan . |
| 2-281681 | 11/1990 | Japan . |
| 3-110885 | 5/1991 | Japan . |

OTHER PUBLICATIONS

By G. Morthier et al., "A Nwe DFB-Laser Diode with Reduced Spatial Hole Burning", Jun. 1990, pp. 388-390, IEEE Photonics Technology Letters.
By M. Ishino et al., "High-performance analog-transmission characteristics of 1.3-μm-wavelength multiple quantum-weil distributed-feedback laser", Feb. 20, 1991, p. 93.
By. K. Kamite et al., "High Reliability 1.3μm DFB Laser Diodes for 40Channel AM Analog CATV Systems", Jan 1990, pp. 499-501.

*Primary Examiner*—Rodney B. Bovernick
*Assistant Examiner*—Robert E. Wise
*Attorney, Agent, or Firm*—Young & Thompson

[57] ABSTRACT

A distributed-feedback laser has a diffractive grating, an optical waveguide layer, and an active region. The optical waveguide layer has equivalent refractive indexes larger towards cavity end facets and smaller towards a device center portion along a cavity. The active region containing the optical waveguide layer has widths wider towards the cavity end facets and narrower towards the device center portion along the cavity. The optical waveguide layer has a uniform electric intensity distribution along the cavity to improve the linearity of current versus optical output characteristics. In another arrangement, the optical waveguide layer formed on the diffractive grating has in its compositions longer wavelengths towards the cavity end facets and shorter wavelengths towards the cavity center portion along the cavity, whereby the optical waveguide layer has a uniform optical intensity distribution along the cavity to improve the linearity of current versus optical output characteristics. The distributed-feedback laser provided is with improved analog modulation distortion characteristics.

8 Claims, 11 Drawing Sheets

DISTRIBUTED-FEEDBACK LASER WITH IMPROVED ANALOG MODULATION DISTORTION CHARACTERISTICS AND METHOD FOR FABRICATING THE SAME

BACKGROUND OF THE INVENTION

1. Field of the Invention

The present invention relates to a semiconductor laser, and more particularly to a distributed-feedback laser with improved analog modulation distortion characteristics and a method for fabricating the same.

2. Description of the Related Art

A low-distortion distributed-feedback laser is demanded for an analog modulation light source for use in a subcarrier multiplex optical transmission such as a CATV (Cable Television) system. Intermodulation distortion of the distributed-feedback laser is greatly influenced by the linearity of current versus optical output characteristics of the laser. In a conventional distributed-feedback laser, the linearity of the current vs. optical output characteristics is poor due to nonuniformity of the longitudinal electrical field distribution in the laser cavity and, for this reason, it is difficult to obtain satisfactory distortion characteristics for analog transmission. Because the device characteristics are greatly influenced by the grating phases at both cleaved facets, there have been large difference in the characteristics in individual devices, and this has made it difficult to obtain stable single-mode operable devices with high production yield.

A conventional DFB (distributed-feedback) laser is mostly and primarily for use in digital modulation, so that there has developed a λ/4 phase-shift DFB laser having a phase shift region in the center of grating and asymmetrical coatings for making a large gain difference large between a main mode and a sub-mode. However, even in such a λ/4 phase-shift DFB laser, there has been a problem of the occurrence of two-mode operation due to spacial hole burning, i.e., a nonuniform carrier density distribution resulting from a nonuniform electrical field distribution.

As a means to attempt to overcome the above problem, there has been a proposal wherein changes are made in the depths, shapes or widths of groves of diffraction gratings along the active region (that is, in the direction in which light propagates). Examples of such a proposal are found in Japanese Patent Application Kokai Publication Nos. H2-90688, H2-172289, H3-110885 and H2-20087. Japanese Patent Application Kokai Publication No. H2-281681 discloses an example wherein an attempt has been made to control the coupling constant to attain single-mode operation by changing stripe widths of an optical waveguide layer having the diffraction gratings.

In the conventional DFB laser, a phase shift region is provided at a portion of the diffraction grating (usually in the neighborhood of the center thereof) and, due to the occurrence of concentration of electric fields at that portion, there has occurred spacial hole burning. In order to reduce the occurrence of such spacial hole burning, it has been necessary to make a precise control of the shapes and widths of the groves or corrugations of the diffraction grating, and this has presented problems relating to manufacturing precision and production yield.

Also, in the conventional DFB laser, since it is not intended for analog modulation and no consideration is given to the linearity of current vs. optical output, the characteristics as required for analog modulation have been poor.

In the conventional DFB laser or phase-shift DFB laser having asymmetrical coatings, electrical field distribution along the cavity is nonuniform, which makes the linearity of current vs. optical output poor and renders such DFB laser unsuitable for use in analog optical communication.

The DFB laser for use in analog optical communication requires severe low distortion characteristics. Especially, for example, in the DFB laser used in the 42 channel cable television (CATV) networks, the low distortion characteristics, such as CSO (composite second-order distortion) $\leqq -60$ dBc and CTB (composite triple beat distortion) $\leqq -65$ dBc must be satisfied. This requirement is not met by the conventional DFB laser as described above.

SUMMARY OF THE INVENTION

It is, therefore, an object of the present invention to overcome the problems existing in the prior art and to provide a distributed-feedback laser for analog optical modulation in which the distortion characteristics are improved and which is fabricated with low cost and high production yield.

It is another object of the present invention to provide a DFB laser for use in analog optical communication which is equipped with a stable single-mode oscillation and low distortion characteristics, and also to provide a method for fabricating the same with an improved production yield.

In one arrangement according to the invention, the electrical field distribution is made uniform by changing widths of an active layer along the cavity and, in another arrangement according to the invention, the optical intensity is made uniform by changing the composition of the layer grown as the optical waveguide.

According to one aspect of the present invention, there is provided a distributed-feedback laser with improved analog modulation distortion characteristics, comprising:

a diffraction grating:

an optical waveguide layer formed on the diffraction grating; and an active region formed on the optical waveguide layer, the optical waveguide layer having equivalent refractive indexes larger towards cavity (device) end facets and smaller towards a device center portion along an active region to improve linearity of current versus optical output characteristics.

According to another aspect of the present invention, there is also provided a method for fabricating a distributed-feedback laser, the method comprising the steps of:

forming, on a surface of a grating, an insulating layer with a stripe shape opening and with patterns whose overall widths are wider towards cavity (device) end facets and narrower towards device center portions;

selectively growing an optical waveguide layer at the stripe shaped opening by a vapor phase epitaxy method;

forming, after removal of the insulating layer, semiconductor layers including an active layer and a clad layer; and forming at least one p-type electrode and one n-type electrode.

BRIEF DESCRIPTION OF THE DRAWINGS

The above and other objects, features and advantages of the present invention will be apparent from the following description of preferred embodiments of the invention explained with reference to the accompanying drawings, in which:

FIG. 7A being for composition distribution of the optical waveguide layer, FIG. 7B for coupling coefficient distribution of grating, FIG. 7C for optical intensity distribution, and FIG. 7D being for current vs. optical output characteristics;

PREFERRED EMBODIMENTS OF THE INVENTION

Now, preferred embodiments of the invention will be explained hereunder with reference to the accompanying drawings.

Figure 1:
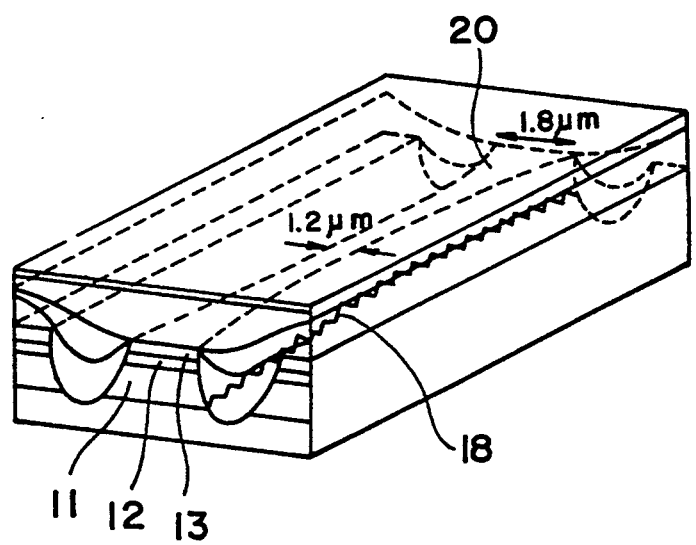
FIG. 1 is a perspective view of an InGaAsP buried type distributed-feedback laser of a first embodiment according to the invention.

FIG. 1 shows in perspective view an InGaAsP buried type distributed-feedback laser of the first embodiment of the invention. Steps of fabricating such distributed-feedback laser are illustrated in FIGS. 4A–4E. In the structure shown, the width of an InGaAsP optical waveguide layer 11 of a bandgap wavelength of 1.15 $\mu$m including a diffraction grating 18, the width of an InGaAsP active layer 12 of the bandgap wavelength of 1.3 $\mu$m, and the width of a p-InP clad layer 13 formed on the active layer 12 are respectively 1.8 $\mu$m at their end facets and 1.2 $\mu$m at their center portions.

Figure 4A:
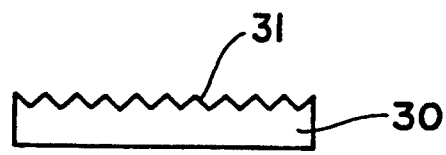
FIGS. 4A to 4E are diagrams illustrating the steps for fabricating the distributed-feedback laser of the first embodiment according to the invention.

The steps of fabricating the structure are as follows. As seen in FIG. 4A, there is formed on an n-InP substrate 30, by an optical interference exposure method, a diffraction grating 31 with a period of 2025 Angstroms and a depth of 250 Angstroms.

Figure 4B:

FIG. 4B shows that, on the diffraction grating 31, there are formed by an MOVPE (metal organic vapor phase epitaxy) method an n-InGaAsP optical waveguide layer 32 of 1000 Angstroms, an InGaAsP active layer 33 of 1200 Angstroms, and a p-InP clad layer 34 of about 0.5 $\mu$m in film thicknesses.

Figure 4C:
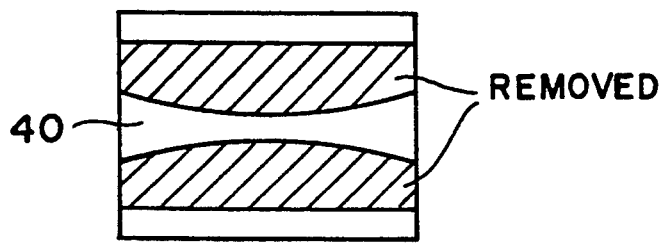
Figure 4D:
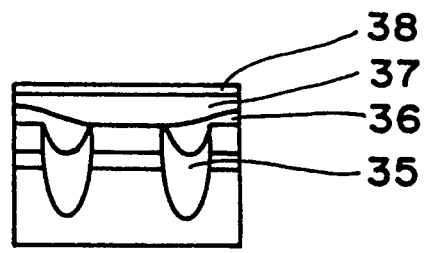
Figure 4E:
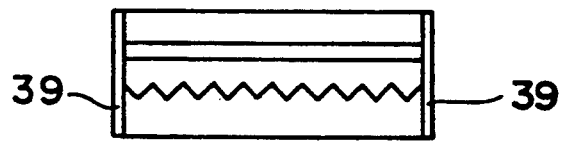
Figure 5:
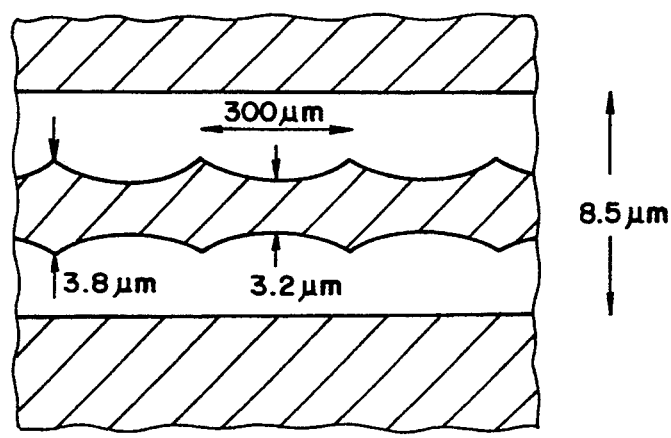
FIG. 5 is a diagram showing a mask used in an etching process in the first embodiment of the invention.

After the above layered structure is formed, a positive type photoresist is applied thereto and, by using a mask as shown in FIG. 5, the necessary exposure and etching are performed whereby the stripes 40 shown in FIG. 4C are formed. The widths of the stripes formed by using the mask shown in FIG. 5 are 1.8 $\mu$m at a widest point and 1.2 $\mu$m at a narrowest point, respectively. Thereafter, there are formed, as seen in FIG. 4D, by an LPE (liquid-phase epitaxial) growth method a p-InP current block layer 35, an n-InP current block layer 36, a p-InP clad layer 37, and a p-InGaAsP cap layer 38 of 1.4 $\mu$m in wavelength. Then, the evaporation of electrodes is performed and the cleaving is made at the portions where the stripe widths are widest. As shown in FIG. 4E, each of the two end facets is provided with a coating 39 in an SiN film having the reflectivity of 1%. A chip is cut out from the resulting structure. The element thus experimentally made has been used in a module and a CATV 42 channel transmission has been tested. As a result, it has been confirmed that the distortion characteristics are very good with $CSO < -75$ dBc and $CTB < -85$ dBc.

Figure 2A:
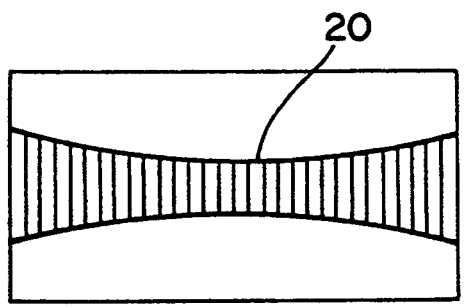
FIG. 2A is a top view of an active region of the distributed-feedback laser of the first embodiment according to the invention.
Figure 2B:
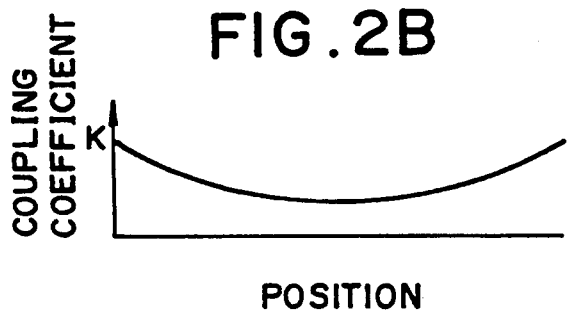
FIG. 2B is a graph showing the equivalent coupling coefficient $\kappa$ obtained in the first embodiment.
Figure 2C:
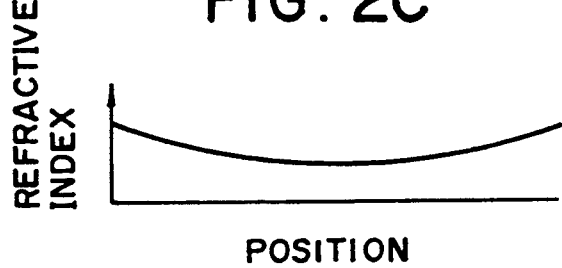
FIG. 2C is a graph showing the refractive index distribution obtained in the first embodiment.
Figure 2D:
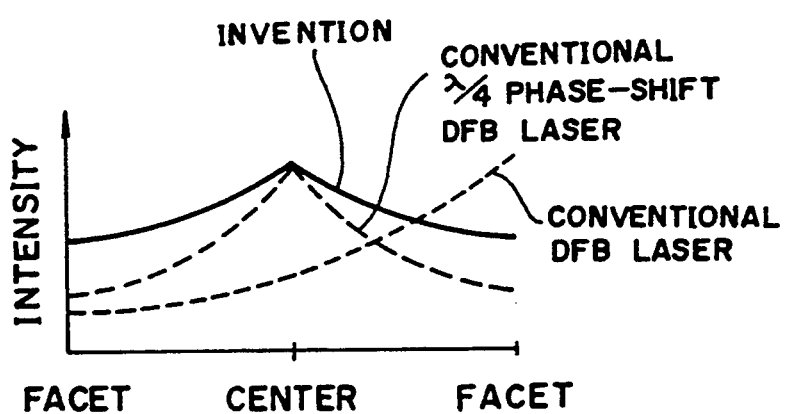
FIG. 2D is a graph showing the electric field intensity distribution obtained in the first embodiment of the invention in comparison with that obtained in the prior art arrangements.

Now, theories of operation of the invention are explained with reference to FIGS. 2A–2D and FIGS. 3A–3D. FIG. 2A shows a top view of an active region of the distributed-feedback laser of the embodiment according to the invention, in which it is noted that the optical waveguide 20 has wider widths at its both end facets of the cavity and a narrower width at its center portion. In this case, as shown in FIG. 2B, the equivalent coupling coefficient $\kappa$ becomes larger towards the end facets and smaller towards the center of the optical waveguide 20. The refractive index distribution for the above is as shown in FIG. 2C. Thus, as compared with the conventional distributed-feedback laser with a λ/4 phase shift or the distributed-feedback laser having an active layer of a uniform width, the electrical field distribution of the laser of the embodiment according to the invention is improved in the nonuniformity of the electric field intensity as seen in FIG. 2D.

Figure 3A:
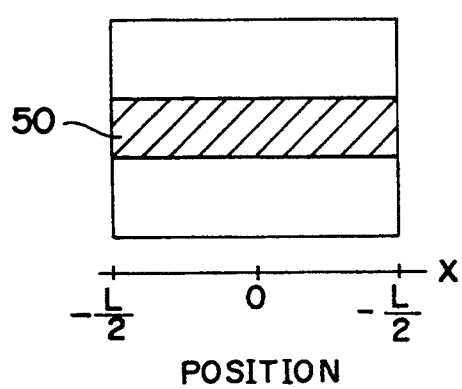
FIGS. 3A to 3D are diagrams and graphs showing the configuration of the active region and the electric field intensity distribution of the embodiment of the present invention in comparison with those of the prior art.
Figure 3B:
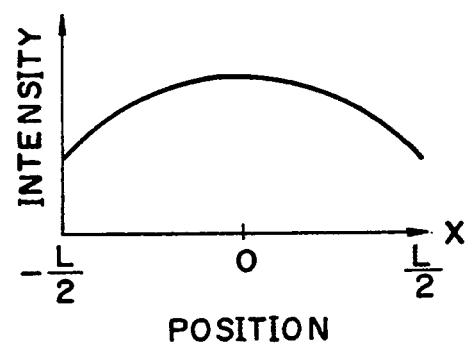
Figure 3C:
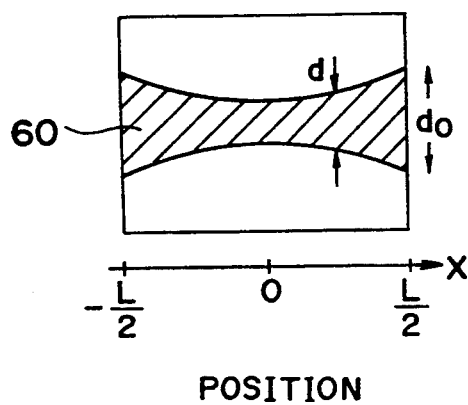
Figure 3D:
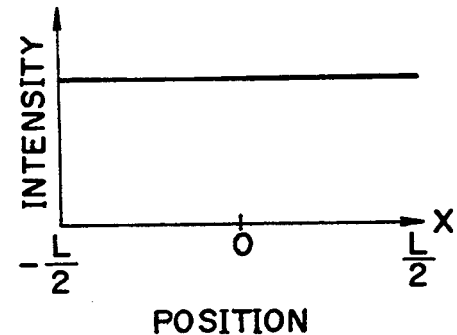

In order to make the electric field intensity distribution in the cavity completely uniform, it is necessary to provide variations appropriately to the width of the active region 50 along the cavity (active region). FIGS. 3A and 3C respectively show in diagrammatic top views the shape of the active region in respect of the conventional distributed-feedback laser having an active layer of uniform width and the active layer 60 in respect of the distributed-feedback laser of the embodiment according to the invention. FIGS. 3B and 3D respectively show the electric field intensity distribution in the former and that in the latter. The analysis has revealed that, in the case of the distributed-feedback laser that has a uniform diffraction grating, the electric field intensity distribution along the cavity is as shown in FIG. 3B in most cases and this can be assimilated in trigonometric functions. Therefore, where the width of the waveguide along the cavity is provided to satisfy $d = d_O(1 - a\cos^2(2\pi X/L))$ wherein $d_O$ is a constant, a is a constant satisfying $0 < a < 1$ and L is the cavity length, $-L/2 < X < L/2$, as in FIG. 3C, it is possible to make the electric field intensity distribution substantially completely uniform.

Since, as seen in FIG. 2C, the equivalent refractive index at the center portion of the waveguide is effectively smaller as compared with that near the end facets, the wavelength within the waveguide becomes longer in a region near the center and this results in an effect substantially equivalent to the introduction of a phase shift in the waveguide. Thus, if the active layer width takes the functional equation as given above, it is possible to provide a λ/4 phase shift whereby a stable single mode oscillation is obtained. According to the calculation, if the widths of the active regions are in a range from 1.6 to 2.0 μm at the end facets and 1.0 to 1.5 μm at the center portion, hence in ranges of $d_O = 1.6 \sim 2.0$ and $a = 0.1 \sim 1.0$, it is possible to provide the λ/4 phase shift. Thus, one of the advantages is that it is not necessary for the laser according to the invention to provide such a special phase shift structure as was required in the prior art arrangement.

Furthermore, according to the first embodiment of the invention, since the coatings with reflectivity lower than about 1% may be applied at both end facets of the laser, the electric field intensity at regions near the end facets can be made high relatively and thus the uniformity of the electric field intensity can be further improved.

According to the first embodiment of the invention, since the active region containing the optical waveguide is made wide at both ends thereof and narrow at the center portion, the electric field intensity distribution is uniform. Thus, it is possible to fabricate in a high production yield the distributed-feedback laser with improved analog modulation distortion characteristics, which oscillates in a stable single-mode and in which the linearity of current vs. optical output is good.

Now, the second embodiment of the invention is explained with reference to the drawings.

Figure 6A:
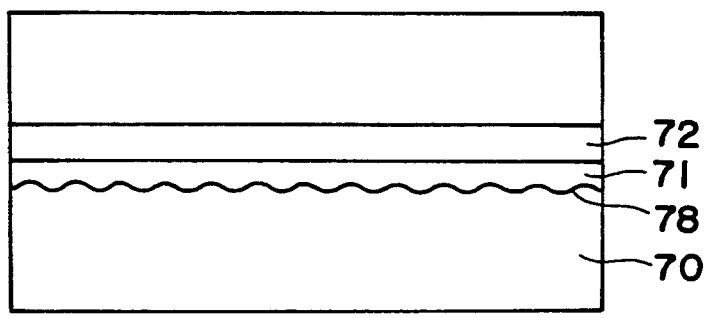
FIG. 6A is a diagrammatic sectional view along the cavity of the distributed-feedback laser of the second embodiment of the invention.
Figure 6B:
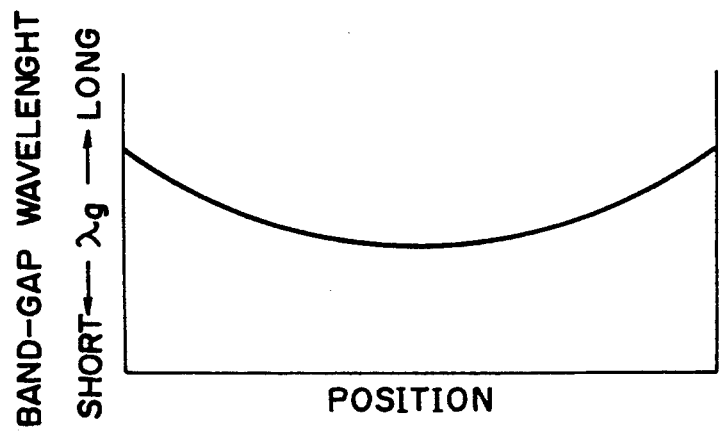
FIG. 6B is a graph showing a bandgap wavelength distribution along the cavity of the optical waveguide layer of the laser of the second embodiment of the invention.

As shown in FIG. 6A, an optical waveguide layer 71 and an active layer 72 are formed on a diffraction grating 78. FIG. 6B shows the composition distribution along the cavity in the optical waveguide layer 71 and the compositions are shown in a bandgap wavelength λg. It is so designed that the bandgap wavelength is short at a center portion of the cavity and becomes longer waves towards the end facets.

Figure 7A:
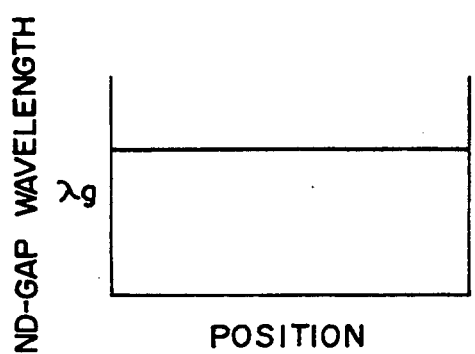
FIGS. 7A to 7D are diagrams and graphs intended to illustrate operational theories in the prior art.
Figure 7B:
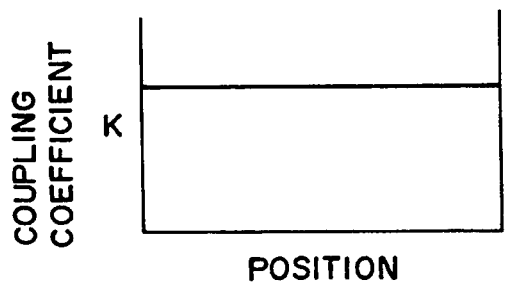
Figure 7C:
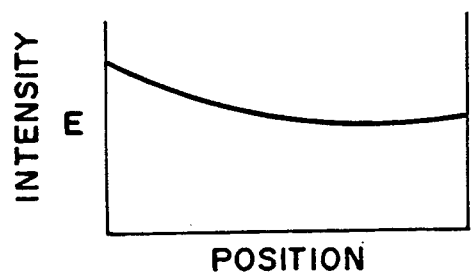
Figure 7D:
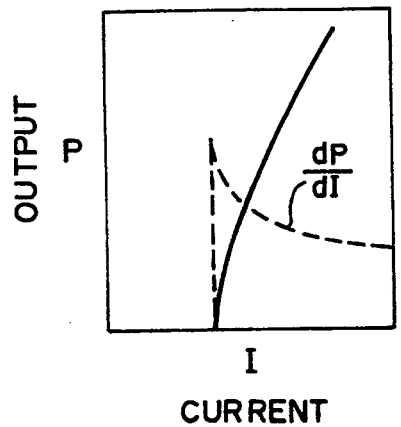
Figure 8A:
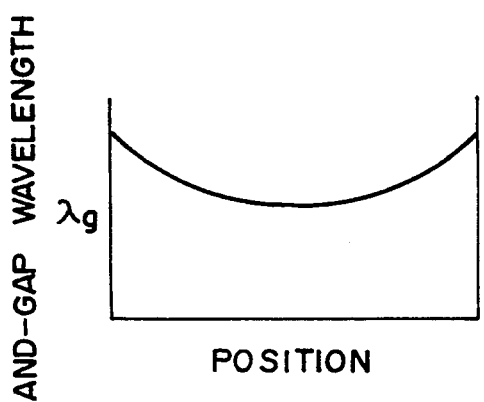
FIGS. 8A to 8D are diagrams and graphs intended to illustrate operational theories of the invention, FIG. 8A being for composition distribution of the optical waveguide layer, FIG. 8B for coupling coefficient distribution of grating, FIG. 8C for optical intensity distribution, and FIG. 8D being for current vs. optical output characteristics.
Figure 8B:
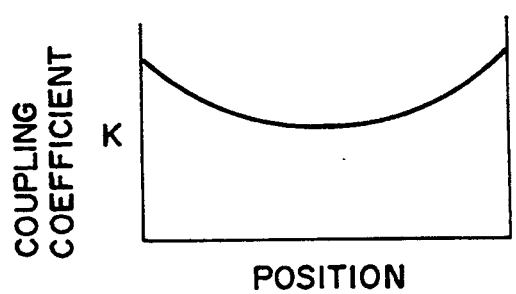

In FIGS. 7A to 7D and FIGS. 8A to 8D, the structure according to the invention is compared with that of the prior art in which the diffraction grating is uniform and the reflectivity at both the end facets are asymmetrical. FIG. 7A and FIG. 8A show the composition distributions along the cavity of the optical waveguide layer, in which it is seen that, whereas the distribution has been uniform in the prior art as shown in FIG. 7A, the bandgap wavelength at the center portion of the cavity according to the invention is set in a short as shown in FIG. 8A. In this configuration, as seen in FIG. 8B, the coupling coefficient κ of the grating is small at the center portion of the cavity and becomes larger at portions towards the end facets of the cavity. In the prior art arrangement, the coupling coefficient κ has been constant in the cavity as shown in FIG. 7B.

Figure 8C:
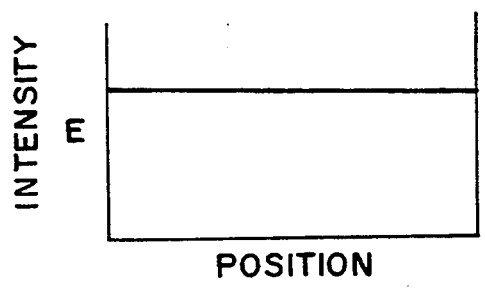

FIG. 7C and FIG. 8C show distributions of the optical intensity (E) within the cavity. In the conventional structure, due to asymmetrical end facet reflective indexes, the optical intensity distribution is nonuniform so that, as seen in FIG. 7D, the linearity of the current vs. optical output characteristics of the semiconductor laser has been poor. This has been a cause for the occurrence of distortion during the analog modulation.

Figure 8D:
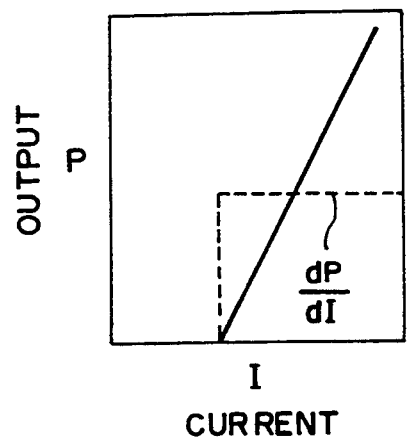

According to the second embodiment of the present invention, since the optical intensity distribution is uniform as shown in FIG. 8C, the linearity of the current vs. optical output characteristics obtained is very good as seen in FIG. 8D.

Now, how the structure as described above is fabricated according to the invention is explained with reference to FIG. 9A. An example here relates to the selective growth of InGaAsP layers using an SiO$_2$ mask.

Figure 9A:
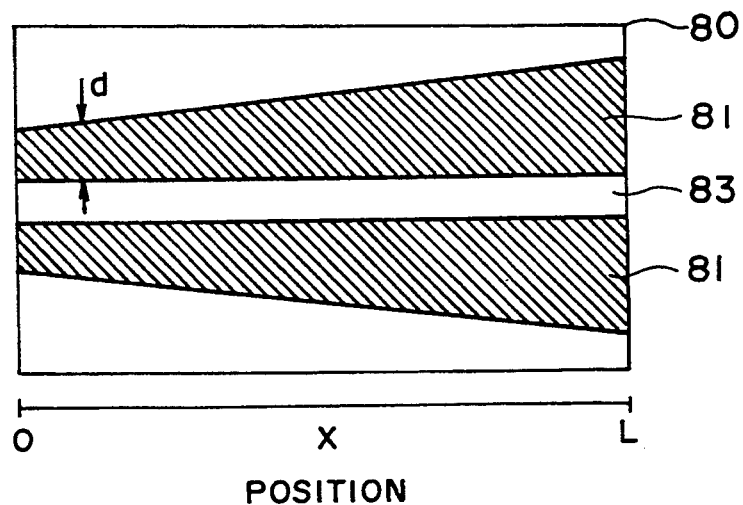
FIG. 9A is a diagrammatic top view of the optical waveguide in a state in which it is being fabricated according to the second embodiment of the invention.
Figure 9B:
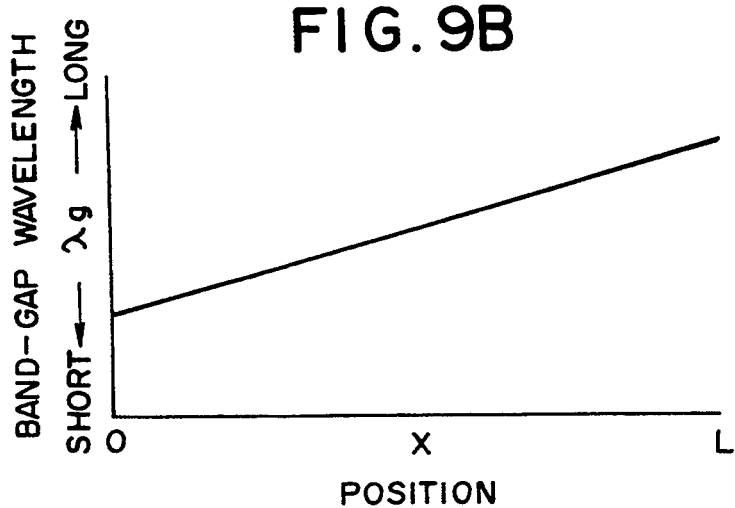
FIG. 9B is a graph showing the bandgap wavelength distribution of the optical waveguide in the cavity according to the second embodiment of the invention.
Figure 9C:
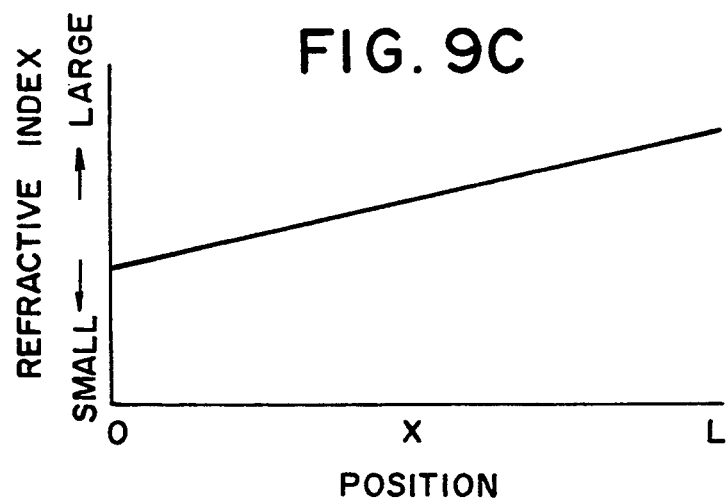
FIG. 9C is a graph showing the refractive index distribution according to the second embodiment of the invention.
Figure 10:
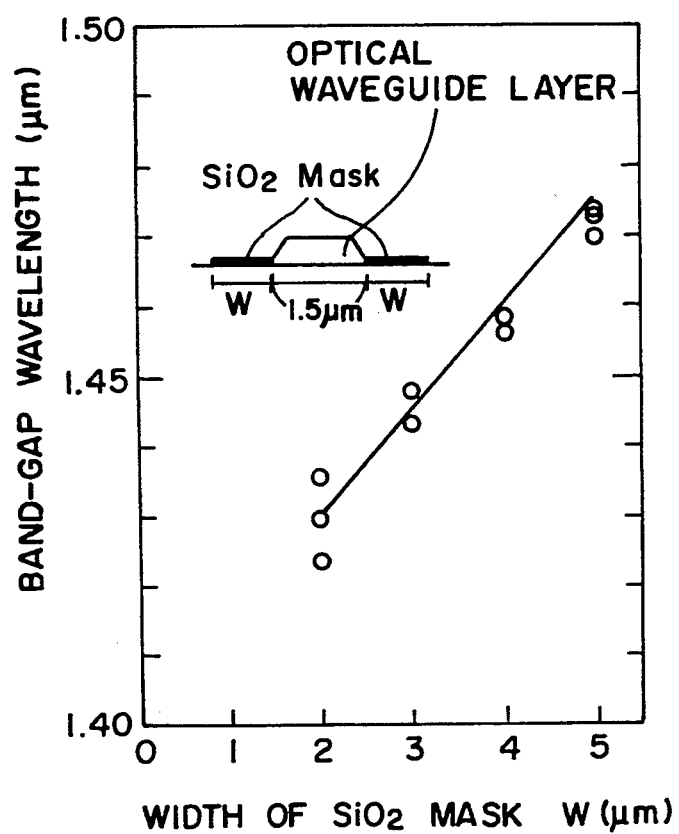
FIG. 10 is a diagram showing the relationship between the width of an $SiO_2$ mask and the bandgap wavelength of an InGaAsP optical waveguide layer according to the second embodiment of the invention.

When the InGaAsP layers are selectively grown on an InP substrate 80 having SiO$_2$ masks 81 with patterns as shown in FIG. 9A, the composition of the InGaAsP layer which grows in an opening 83 in a stripe shape between the mask patterns shows longer wavelengths substantially in proportion to an increase in the widths "d" of the mask patterns. FIG. 10 shows the relationship between the mask pattern width W μm and the composition of the optical waveguide layer when the opening is 1.5 μm, as an example. On the other hand, since the refractive index of the InGaAsP layer becomes larger as the wavelength becomes larger, the refractive index of the InGaAsP layer becomes larger as the pattern width becomes larger as seen in FIG. 9C.

Since the distributed-feedback laser according to the invention is provided with the InGaAsP optical waveguide layer formed by the selective growth as explained above, the refractive index of the optical waveguide layer is large at the end facet of the cavity where the mask pattern is large and is small at the center portion of the cavity where where the mask pattern is narrow. Accordingly, the coupling coefficient κ in relation to the diffraction grating is small in the center portion of the cavity and large in the neighborhood of the end facet of the cavity.

Thus, by appropriately adjusting the distribution of the coupling efficiency κ, the optical intensity distribution within the cavity is made uniform, whereby the structure is rendered not susceptible to influence from the spatial hole burning and the linearity of the current versus optical output characteristics is improved.

Further, since the equivalent refractive index of the optical waveguide layer at the center portion is small as compared with that in the neighborhood of the end facet, the optical wavelength within the cavity becomes large at the center portion, which in substance results in the effect equivalent to the phase shaft being introduced. When the amount of the phase shaft is chosen as $\lambda/4$, it is possible to obtain a stable single-mode oscillation.

Now, details of the fabrication method for the distributed-feedback laser of this embodiment according to the invention are explained with reference to the drawings.

As seen in FIGS. 11A–11D and FIGS. 12A–12C, an n-InP substrate 70 has uniform gratings 78 formed by an optical interference exposure method.

Figure 11A:
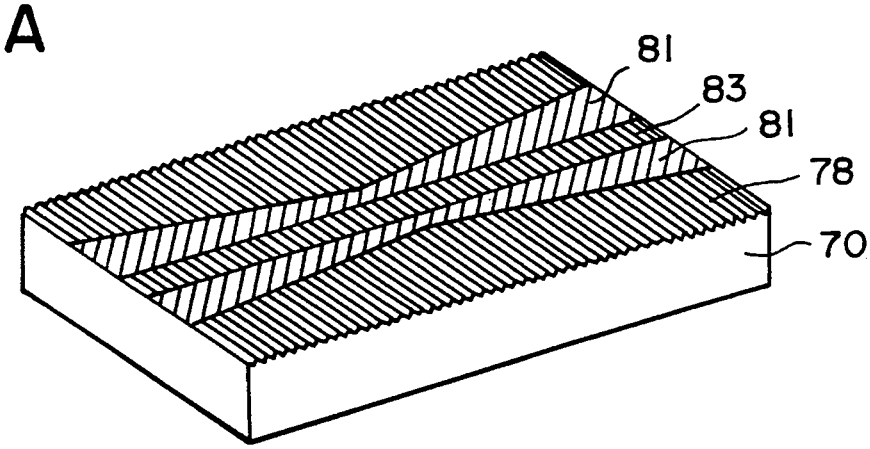
FIGS. 11A to 11D are diagrams intended to illustrate the steps for fabricating the distributed-feedback laser of the second embodiment according to the invention.

Then, as shown in FIG. 11A, an $SiO_2$ mask 81 with an opening portion 83 in a stripe shape having the width of 1.5 $\mu$m is formed on an n-InP substrate 70. The width of the mask 81 is 2 $\mu$m at the center portion and 5 $\mu$m at the end facet portion.

Figure 11B:
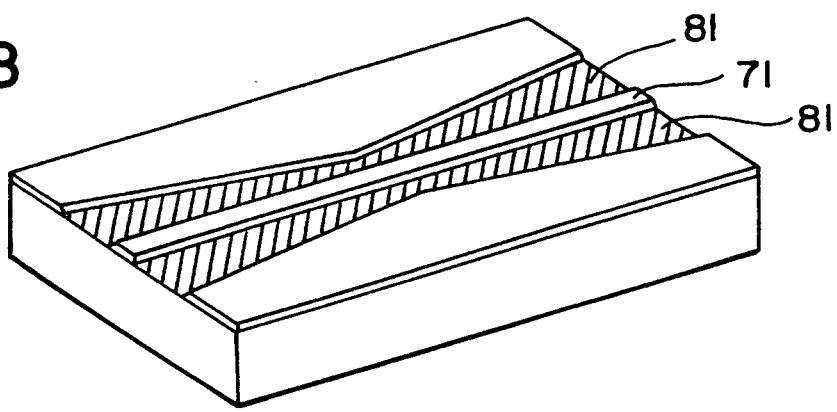

Next, as seen in FIG. 11B, an InGaAsP optical waveguide layer 71 is selectively grown by a reduced pressure MOVPE (metal Organic Vapor Phase Epitaxy) method.

Figure 11C:
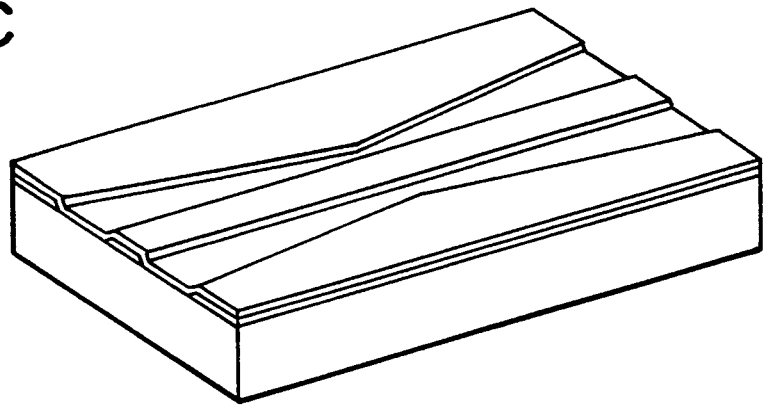
Figure 11D:
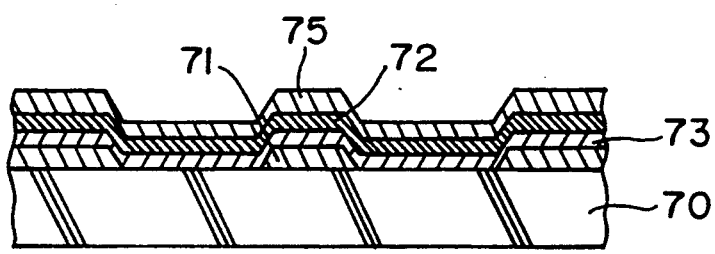

Then, as seen in FIGS. 11C and 11D, the $SiO_2$ mask 81 is removed and this is followed by the growth of an n-InP spacer layer 73 (0.04 $\mu$m thick), a multiple quantum-well (MQW) active layer 72 (InGaAsP wells ($\lambda g=1.40$ $\mu$m) of 62 Angstroms, InGaAsP barriers ($\lambda g=1.13$ $\mu$m) of 100 Angstroms, the number of wells being 7), and a p-InP clad layer 75 (0.7 $\mu$m thick).

Figure 12A:
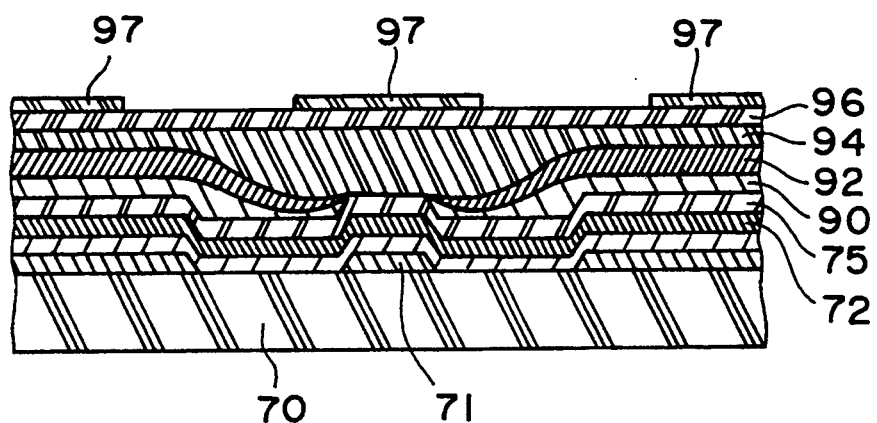
FIGS. 12A to 12C are diagrams intended also to illustrate the steps for fabricating the distributed-feedback laser of the second embodiment according to the invention.

Thereafter, as seen in FIG. 12A, by a liquid phase epitaxial growth (LPE) method, there are grown a p-InP layer 90 (0.3 $\mu$m thick), an n-InP layer 92 (0.2 $\mu$m thick), a p-InP layer 94 (0.3 $\mu$m thick), and a p-InGaAsP layer 96 (1.0 $\mu$m thick), whereby a double channel planar buried hetero (DC-PBH) structure is formed. Then, etching masks 97 are formed for making mesa electrodes.

Figure 12B:
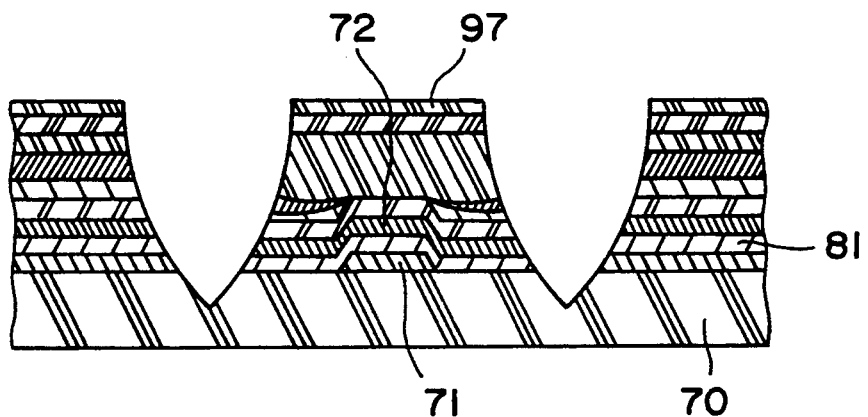
Figure 12C:
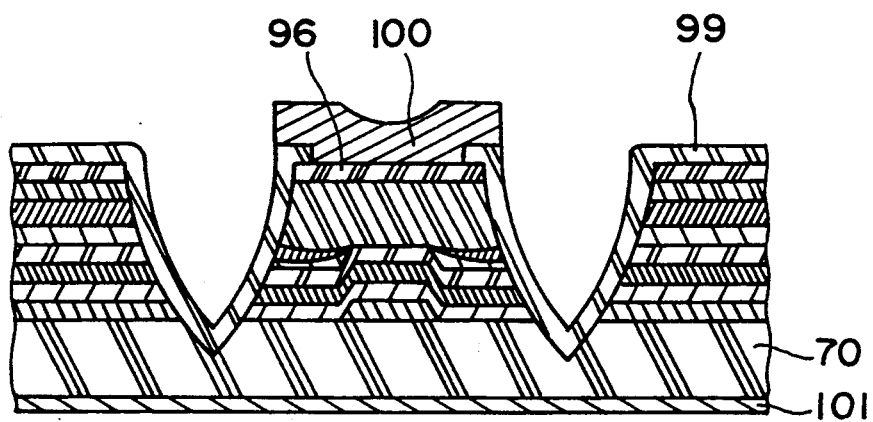

As shown in FIG. 12B, the layered structure is etched until the etching reaches the n-InP substrate 70 and, as seen in FIG. 12C, after the etching mask 97 is removed, an insulating mask 99 is formed. In the insulating mask 99, an opening is made and the mesa electrode 100 is formed thereat.

The InP substrate is polished to the thickness of about 150 $\mu$m and an electrode 101 is formed. The resulting structure is cleaved such that the cavity length becomes approximately 300 $\mu$m, and this completes the fabrication of the laser according to the invention.

In the element thus fabricated, the linearity of the current vs. optical output characteristics is excellent, and the element is suited to analog modulation.

The cavity is so arranged that the bandgap wavelength of the optical waveguide layer becomes short at a center region of the device. The bandgap wavelength is shortest in this region and becomes progressively longer towards the end facets of the laser.

In this embodiment, no coatings have been applied to end facets of the laser. However, a coating with a 1% reflectivity may be applied on one end facet and a coating with a 75% reflectivity on the other end facet, which can enhance the slope efficiency with high optical output. In this case, the electrical field distribution in the direction along the active region becomes nonuniform but this can be improved by controlling the compositions of the optical waveguide layers. Thus, according to the characteristics for the required slope efficiency and the linearity, the compositions of the optical waveguide layers and the reflectivity of the end facet coatings may be changed appropriately and, by doing so, it is possible to obtain the semiconductor laser in which both the output characteristics and the linearity are improved.

According to the second embodiment of the invention, the compositons of the optical waveguide layer are controlled by the selective growth so that the optical waveguide layer has a uniform optical field distribution along the cavity thereby enabling to reduce spatial hole burning and to improve the linearity of current vs. optical output characteristics.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A distributed-feedback laser with improved analog modulation distortion characteristics and improved current versus optical output linearity characteristics, comprising:
    a diffraction grating;
    an optical waveguide layer formed on said diffraction grating; and
    an active region formed on said optical waveguide layer,
    said optical waveguide layer having equivalent refractive indexes larger towards cavity end facets and smaller towards a device center portion along the cavity to improve the linearity of current versus optical output characteristics.

2. A distributed-feedback laser according to claim 1, in which said active region containing said optical waveguide layer has a width wider towards the cavity end facets and narrower towards the device center portion along the cavity to provide the improved linearity of current versus optical output characteristics.

3. A distributed-feedback laser according to claim 2, in which the width "d" of said active region along said cavity is given by $d=d_O (1-a\cos^2(2\pi X/L))$ wherein $d_O$ is a constant, a is constant satisfying $0<a<1$, and L is a cavity length, $-L/2<X<L/2$.

4. A distributed-feedback laser according to claim 2, in which the width of said active region is in a range from 1.6 $\mu$m to 2.0 $\mu$m at the end facets thereof and in a range from 1.0 $\mu$m to 1.5 $\mu$m at the center portion thereof.

5. A distributed-feedback laser according to claim 2, in which each of said end facets has a coating with reflectivity lower than about 1%.

6. A distributed-feedback laser according to claim 1, in which said waveguide layer has in its compositions a bandgap wavelength longer towards cavity end facets and shorter towards the device center portion along said cavity to provide the improved linearity of current versus optical output characteristics.

7. A method for fabricating a distributed-feedback laser, said method comprising the steps of:
    forming, on a surface of a grating, an insulating layer with a stripe shape opening and with patterns whose overall widths are wider towards the cavity end facets and narrower towards device center portions;

selectively growing an optical waveguide layer at said stripe shaped opening by a vapor phase epitaxy method:

forming, after removal of said insulating layer, semiconductor layers including an active layer and a clad layer; and forming at least one p-type electrode and one n-type electrode.

8. A method for fabricating a distributed-feedback laser according to claim 7, in which an InGaAsP optical waveguide layer is grown at said stripe shaped opening, the composition distribution of said InGaAsP being such that a bandgap wavelength is longer towards the end facets and shorter towards the center portion and a refractive index of the waveguide layer is larger towards the end facets and shorter towards the center portion, hence a coupling coefficient $\kappa$ of the grating is larger towards the end facets and smaller towards the center portion.

* * * * *